(12) United States Patent
Siddiqi

(10) Patent No.: US 12,271,672 B1
(45) Date of Patent: Apr. 8, 2025

(54) DETERMINISTIC PARALLEL ROUTING APPROACH FOR ACCELERATING PATHFINDER-BASED ALGORITHMS

(71) Applicant: KING FAHD UNIVERSITY OF PETROLEUM AND MINERALS, Dhahran (SA)

(72) Inventor: Umair Farooq Siddiqi, Dhahran (SA)

(73) Assignee: KING FAHD UNIVERSITY OF PETROLEUM AND MINERALS, Dhahran (SA)

( * ) Notice: Subject to any disclaimer, the term of this patent is extended or adjusted under 35 U.S.C. 154(b) by 0 days.

(21) Appl. No.: 18/804,644

(22) Filed: Aug. 14, 2024

(51) Int. Cl.
- *G06F 30/30* (2020.01)
- *G06F 30/347* (2020.01)
- *G06F 30/394* (2020.01)
- *G06F 30/396* (2020.01)

(52) U.S. Cl.
CPC .......... *G06F 30/347* (2020.01); *G06F 30/394* (2020.01); *G06F 30/396* (2020.01)

(58) Field of Classification Search
None
See application file for complete search history.

(56) References Cited

U.S. PATENT DOCUMENTS

| | | | |
|---|---|---|---|
| 8,201,130 B1 | 6/2012 | Kalman et al. | |
| 11,093,672 B2 * | 8/2021 | Khan | G06F 30/327 |
| 2020/0257838 A1 | 8/2020 | Khan et al. | |

FOREIGN PATENT DOCUMENTS

CN 103886137 B 2/2017

OTHER PUBLICATIONS

J. S. Swartz et al., "A Fast Routability-Driven Router for FPGAs," FPGA 98, Monterey, CA, USA, 1998 ACM, pp. 140-149. (Year: 1998).*
M. Gort et al., "Deterministic Multi-Core Parallel Routing for FPGAs," 2010 IEEE, pp. 78-86. (Year: 2010).*
M. Stojilovic, "Parallel FPGA Routing: Survey and Challenges," 2017 27th Int'l Conference on Field Programmable Logic and Applications (FPL), Ghent, Belgium, 8 pages. (Year: 2017).*

(Continued)

*Primary Examiner* — Leigh M Garbowski
(74) *Attorney, Agent, or Firm* — Oblon, McClelland, Maier & Neustadt, L.L.P.

(57) ABSTRACT

A field-programmable gate array (FPGA) routing tool within a computer-aided design system. The tool includes an input device for receiving a netlist containing nets with source nodes, sink nodes, and intermediate nodes at fixed positions. The tool further includes a processing circuitry configured with a design router responsible for constructing non-overlapping routing trees for all nets, ensuring connections from source nodes to sink nodes without exceeding fixed routing resource capacity of the FPGA. The design router utilizes incremental routing, which applies deterministic parallel routing to a window of initial iterations with high routing workload and sequential routing to subsequent iterations. Additionally, a display device is provided to continuously exhibit interconnections and routing utilization during the determination of routing trees.

16 Claims, 6 Drawing Sheets

(56) References Cited

OTHER PUBLICATIONS

C. H. Hoo et al., "ParaDRo: A Parallel Deterministic Router Based on Spatial Partitioning and Scheduling," 2018 ACM FPGA'18, Session 2: CAD, Feb. 25-27, Monterey, CA, USA, pp. 67-76. (Year: 2018).*

K. E. Murray et al., "VTR 8: High-performance CAD and Customizable FPGA Architecture Modelling," ACM Transactions on Reconfigurable Technology and Systems, vol. 13, No. 2, Article 9, May 2020, 60 pages. (Year: 2020).*

K. E. Murray et al., "Air: A Fast but Lazy Timing-Driven FPGA Router," 2020 IEEE, 5C-2, pp. 338-344. (Year: 2020).*

D. Wang et al., "ParaRA: A Shared Memory Parallel FPGA Router Using Hybrid Partitioning Approach," IEEE Trans. on Computer-Aided Design of Integrated Circuits and Systems, vol. 39, No. 4, Apr. 2020, pp. 830-842. (Year: 2020).*

Y. Zhou et al., "Accelerating FPGA Routing Through Algorithmic Enhancements and Connection-aware Parallelization," ACM Trans. on Reconfigurable Technology and Systems, vol. 13, No. 4, Article 18, Aug. 2020, 26 pages. (Year: 2020).*

C. H. Hoo et al., "ParaFRo: A Hybrid Parallel FPGA Router using Fine Grained Synchronization and Partitioning," 2016 16th Int'l Conference on Field Programmable Logic and Application (FPL), Lausanne, Switzerland, 11 pages. (Year: 2016).*

Minghua Shen, et al., "Combining Static and Dynamic Load Balance in Parallel Routing for FPGAs", IEEE Journal & Magazine, vol. 40, Issue 9, Oct. 15, 2020. 4 pages, Abstract only.

Marcel Gort, et al., "Accelerating FPGA Routing Through Parallelization and Engineering Enhancements Special Section on PAR-CAD 2010", IEEE transactions on computer-aided design of integrated circuits and systems, vol. 31, Issue 1, Dec. 19, 2011, 17 pages.

* cited by examiner

DETERMINISTIC PARALLEL ROUTING APPROACH FOR ACCELERATING PATHFINDER-BASED ALGORITHMS

STATEMENT REGARDING PRIOR DISCLOSURE BY THE INVENTORS

Aspects of this technology are described in an article "A Deterministic Parallel Routing Approach for Accelerating Pathfinder-based Algorithms" Siddiqi, U. F., Grewal, G. & Areibi, S., 2023, 2023 *IFIP/IEEE 31st International Conference on Very Large Scale Integration, VLSI SoC 2023*. IEEE Computer Society, (IEEE/IFIP International Conference on VLSI and System on-Chip, VLSI-SoC).

STATEMENT OF ACKNOWLEDGEMENT

The authors would like to acknowledge the support provided by the Deanship of Scientific Research (DSR) at King Fahd University of Petroleum & Minerals (KFUPM), Dhahran, Saudi Arabia, for supporting this work.

BACKGROUND

Technical Field

The present disclosure is directed to a field of field-programmable gate array (FPGA) design. More specifically, the present disclosure is directed to a deterministic parallel routing for accelerating pathfinder-based algorithms.

Description of Related Art

The "background" description provided herein is for the purpose of generally presenting the context of the disclosure. Work of the presently named inventors, to the extent it is described in this background section, as well as aspects of the description which may not otherwise qualify as prior art at the time of filing, are neither expressly or impliedly admitted as prior art against the present invention.

Field-programmable gate arrays (FPGAs) are integrated circuits designed to be configured by a user after manufacturing. FPGAs consist of an array of programmable logic blocks and a hierarchy of reconfigurable interconnects, allowing blocks to be wired together in different configurations. The FPGAs are used in various applications, from prototyping new digital designs to providing flexible and reconfigurable hardware for systems in fields such as telecommunications, automotive, and aerospace.

Routing in the FPGA design process involves determining the physical paths that signals follow between logic blocks. The routing stage takes a netlist, a data structure representing the electrical connections between components, and determines the specific pathways through the interconnect sources of the FPGA. The primary objective of the routing is to connect all the required nets while adhering to the constraints of routing resources of the FPGA and minimizing delay and congestion. Routing accounts for approximately 41%-86% of the total compilation time in the FPGA design process [K. Murray et. al, *VTR 8: High-Performance CAD and Customizable FPGA Architecture Modelling, ACM Trans. Reconfigurable Technology and Systems*. 13 (2) (May 2020). doi:10.1145/3388617]. The routing stage is provided with an input netlist consisting of a pluraluty of nets, along with the discrete locations of the source and sink nodes associated with each net. A number of nets may reach up to several millions. Routing is for a process of finding a routing tree for each net that connects the source to the sinks without exceeding the capacity of the fixed routing resources available on the FPGA. Since routing is an NP-complete problem [V. Betz, J. Rose, A. Marquardt, *Architecture and CAD for DeepSubmicron FPGAs, Kluwer Academic Publishers, USA,* 1999], it can only be solved approximately.

FPGA routing is typically performed using a variant of a PathFinder router, which is integrated into a versatile place and route (VPR) tool. PathFinder algorithm is a widely adopted routing methodology used within FPGA design tools. PathFinder aims to find efficient routing paths while managing congestion, a common issue in routing where multiple signals compete for the same routing resources. However, PathFinder often requires excessive amounts of time to route large circuits, as it is both sequential and irregular [L. McMurchie, C. Ebeling, *PathFinder: A Negotiation-based Performance-driven Router for FPGA, in: 3rd Int' ACM Symposium on FPGAs,* 1995, pp. 111-117], with unpredictable dependencies between nets. PathFinder uses the negotiated congestion (NC) technique to eliminate congestion and obtain a legal solution. With this technique, nets share a routing resource and negotiate with each other to determine which net needs the resource more than the others. The NC technique adjusts the congestion cost of the routing resources using their current usage and the history of their usage.

Traditional routing algorithms are time-consuming and computationally intensive, particularly for large and complex FPGA designs. Recent advancements have aimed to improve the runtime of the PathFinder algorithm by reducing the number of tree branches that require rip-up and re-routing (RnR) and by enhancing the accuracy of distance estimation to the target in building routing trees. Parallel PathFinder-based routers seek to improve runtime by leveraging multiple cores of modern processors to simultaneously route several nets or partial nets.

However, parallel routing must be deterministic, ensuring the same solution is produced for a given problem instance, which is essential for fast development, debugging, and testing in industrial environments. Parallel routers employ partitioning and scheduling of nets to achieve fast deterministic routing. Despite these improvements, further enhancements are needed to optimize the runtime and solution quality of the parallel routing, particularly when using map-based lookahead techniques.

To address these challenges, an object is an advanced routing method that integrates parallel processing with incremental routing to enhance the efficiency of the FPGA compilation process. An object is a system and method for reducing the runtime of parallel routing tools while maintaining or improving the solution quality in terms of wire length and critical path delay (CPD).

SUMMARY

In an exemplary embodiment, a field programmable gate array (FPGA) routing tool in a computer-aided design system is described. The FPGA routing tool includes an input device for receiving a netlist having nets with source nodes, sink nodes, and a plurality of intermediate nodes at fixed positions and a processing circuitry. The processing circuitry is configured with a design router for building non-overlapping routing trees for all nets, including finding a routing tree for each net that connects the source nodes to the sink nodes without exceeding a capacity of fixed routing resources available on the FPGA. The processing circuitry is further configured with the design router with incremental routing that applies deterministic parallel routing to a window of initial iterations having a high routing workload and sequential routing to remaining iterations.

The FPGA routing tool further includes a display device to continuously display interconnections and a routing utilization while the routing trees are being determined.

In another exemplary embodiment, a non-transitory computer-readable storage medium including computer executable instructions, where the instructions, when executed by a computer, cause the computer to perform a method for routing a field programmable gate array (FPGA) by a routing tool in a computer-aided design system is disclosed. The method includes receiving, by an input device, a netlist having nets with source nodes, sink nodes, and a plurality of intermediate nodes at fixed positions, and building, by processing circuitry, non-overlapping routing trees for all nets, including determining a routing tree for each net that connects the source nodes to the sink nodes without exceeding a capacity of fixed routing resources available on the FPGA. The method further includes applying, by the processing circuitry, deterministic parallel routing to a window of initial iterations having a high routing workload and applying sequential routing to remaining iterations, and continuously displaying, by a display device, interconnections and a routing utilization while the routing trees are being determined.

The foregoing general description of the illustrative embodiments and the following detailed description thereof are merely exemplary aspects of the teachings of this disclosure, and are not restrictive.

BRIEF DESCRIPTION OF THE DRAWINGS

A more complete appreciation of this disclosure and many of the attendant advantages thereof will be readily obtained as the same becomes better understood by reference to the following detailed description when considered in connection with the accompanying drawings, wherein.

Figure 1:
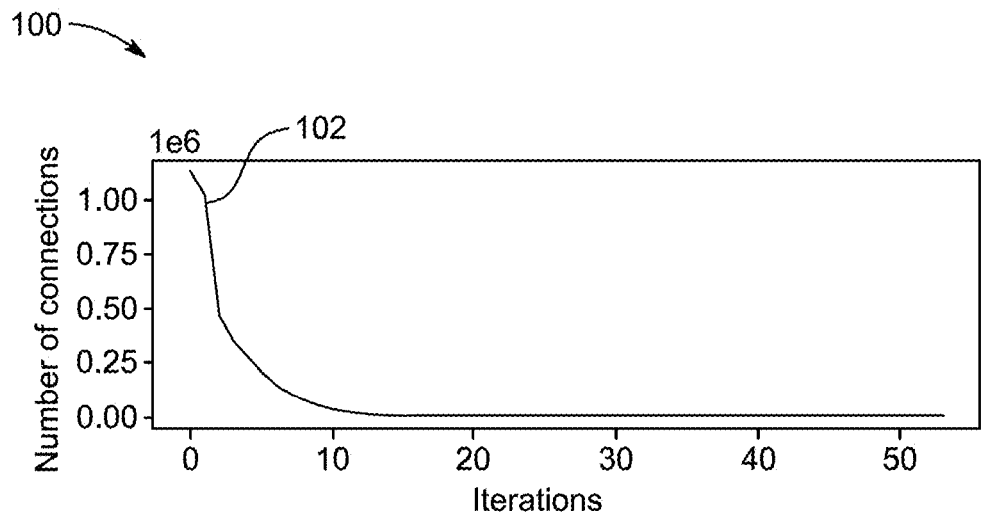
FIG. 1 illustrates a graphical representation of the effect of incremental routing on the workload in which the number of rerouted connections decreases with iterations, in accordance with an exemplary aspect of the disclosure.

The foregoing shall be more apparent from the following more detailed description of the disclosure.

DETAILED DESCRIPTION

In the drawings, like reference numerals designate identical or corresponding parts throughout the several views. Further, as used herein, the words "a," "an" and the like generally carry a meaning of "one or more," unless stated otherwise.

Furthermore, the terms "approximately," "approximate," "about," and similar terms generally refer to ranges that include the identified value within a margin of 20%, 10%, or preferably 5%, and any values therebetween.

Aspects of this disclosure are directed to a system and method for field programmable gate array (FPGA) routing in a computer-aided design (CAD) tool. The disclosure relates to a routing method that integrates parallel processing with incremental routing to enhance the runtime efficiency of the FPGA compilation process.

Routing within the FPGA design flow is a task characterized by its high computational demands, responsible for constructing non-overlapping routing trees for all nets in a netlist. PathFinder is a widely-used routing algorithm, implemented in the versatile-place-and-route (VPR) tool. The latest iteration of PathFinder, incorporated into VPR 8.0, utilizes an incremental routing approach. The method involves rip-up and re-route (RnR) operations exclusively on those branches of the routing trees that encounter congested nodes or experience significant delays in recent iterations. The initial iterations of this process are marked by a substantial workload, requiring the routing of a large number of branches, whereas subsequent iterations handle a comparatively reduced number of branches.

A routing algorithm in a CAD tool of the present disclosure is based on incremental routing. The routing algorithm is a hybrid router that applies deterministic parallel routing during a specified window of initial iterations, which are characterized by a high routing workload, and transitions to sequential routing for the remaining iterations. The routing algorithm results in reducing the runtime by routing in parallel while maintaining or improving the solution quality in terms of wire length and critical path delay (CPD).

The various embodiments throughout the disclosure will be explained in more detail with reference to FIG. 1-FIG. 7.

FIG. 1 illustrates the effect of incremental routing on the workload in which the number of rerouted connections decreases with iterations, based on using a problem from Titan benchmarks. The Titan benchmarks are a suite of benchmark circuits used for evaluating Field-Programmable Gate Array (FPGA) design tools, particularly placement and routing algorithms.

The Titan benchmarks were developed to represent a wide range of FPGA design challenges, including different circuit sizes and complexities, providing a standardized set of problems to test and compare the performance of FPGA design tools. The Titan benchmarks are derived from real-world designs and include a variety of computational and communication tasks, making them suitable for rigorous performance analysis and tool evaluation.

As described earlier with reference to conventional system and methods, the PathFinder routing algorithm is implemented within the versatile place and route (VPR) tool. Graph 100 illustrated by FIG. 1 relates to the PathFinder routing implemented within the VPR tool.

The routing resources of an FPGA can be represented by a routing resource graph (RRG), represented by $G(V, E)$, where G is a directed graph whose set of nodes (V) contains all wiresegments and electrical pins and set of edges (E) contains all programmable switches. The routing problem contains a set of net $N=\{N_0, N_1, \ldots, N_{n-1}\}$, where n is the number of nets, and each net $N_i \in N$ contains contains a source node $s_i$ and one or more sinks $\{t_i^0, t_i^1, \ldots, t_i^{d_i-1}\}$, where $\{s_i, t_i^0, \ldots, t_i^{d_i-1}\} \in V$, and $d_i$ is fanout of $N_i$. The routing resources are set to find a routing tree for each net that connects its source to all sinks while ensuring that the routing trees of all nets remain disjoint, i.e., find $T_i$, $\forall N_i \in N$, s.t., $\cap_{i=0}^{n-1} T_i = \emptyset$.

In the present implementation, the VPR tool is Version 8.0. The incremental method adapted by the VPR Version 8 is also referred to as the adaptive incremental routing (AIR) method in the art. In the first iteration, a connection router (C0) is required to build all branches of all routing trees for all nets. This initial iteration involves a high workload, as shown by curve 102 of the graph in FIG. 1. The workload is represented by the number of branches the connection router must construct.

At the end of each iteration, the connection router rips up branches that are congested or have significantly degraded in delay during the last few iterations. Starting from the second iteration, the AIR method applies incremental routing, which selectively rebuilds only those branches of nets that were ripped up in the previous iteration. This approach reduces the workload and speeds up the routing process.

The graph 100 includes curve 102 that indicates the number of branches the connection has to build per iteration. As the curve 102 shows, the initial iterations have a significantly higher workload compared to the later ones. By applying parallelization to speed up these initial iterations, the overall routing speed can be substantially improved.

A fundamental aspect of the negotiated congestion (NC) technique is the congestion cost of the nodes or routing resources, which is increased in every iteration under certain conditions. This adaptive adjustment of congestion costs helps manage and optimize the routing process over successive iterations.

Figure 2:
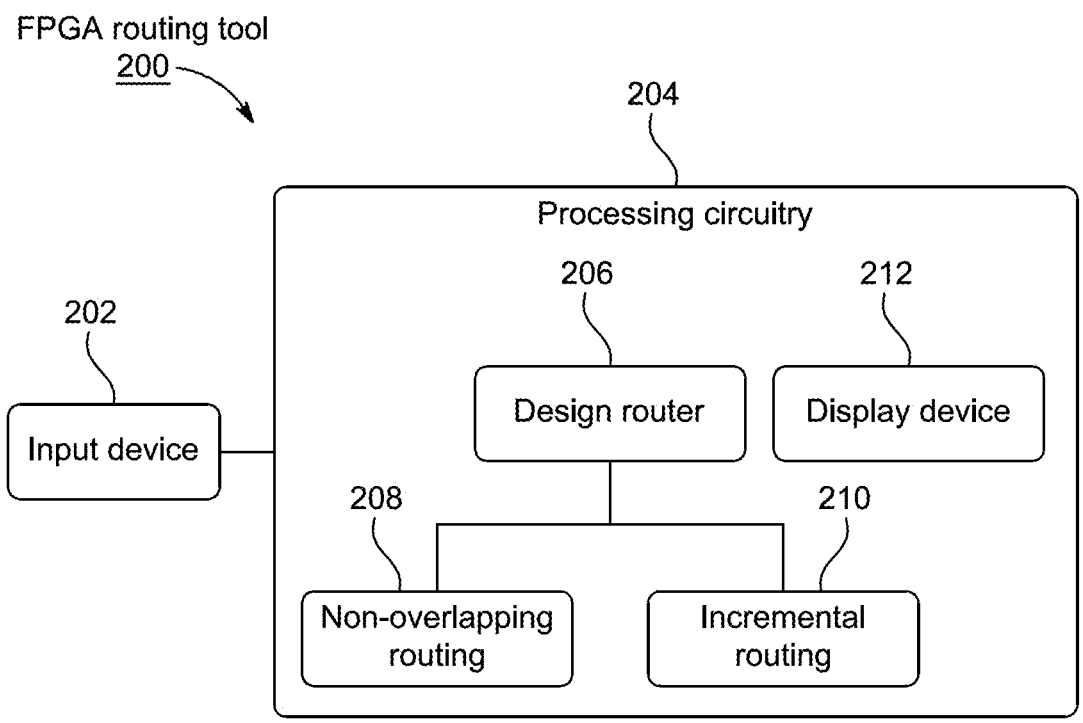
FIG. 2 illustrates a block diagram of a field-programmable gate array (FPGA) routing tool in a computer-aided design system, according to certain embodiments.

The AIR method is implemented based on Algorithm 1, as shown below:

FIG. 2 illustrates a field-programmable gate array (FPGA) routing tool 200 as a component in a computer-aided design tool, in accordance with embodiments of the present disclosure.

The FPGA routing tool 200 includes a plurality of components configured to facilitate the efficient routing of nets within an FPGA. The components of the FPGA routing tool 200 include, but may not be limited to, an input device 202, a processing circuitry 204 having a design router 206 and a display device 212.

The input device 202 of the FPGA routing tool 200 is for receiving a netlist. In particular, the input device 202 is configured to receive the netlist from a user. The user may be a customer or a software designer. The netlist includes the source nodes, sink nodes, and intermediate nodes at fixed positions. In one example, the input device 202 is a Graphical User Interface (GUI) of a computing system, where the user uploads the netlist file. In another example, the input device 202 is an automated system that receives data directly from a design software. Such as, the input device 202 is integrated with a computer-aided design (CAD) software that directly exports the netlist data to the FPGA routing tool 200.

The netlist consists of nets with source nodes, sink nodes, and a plurality of intermediate nodes at fixed positions. The fixed positions are the predetermined and unchangeable locations of the source nodes, sink nodes, and intermediate nodes on the FPGA. The fixed positions are established during the design phase and remain constant throughout the routing process. The input device 202 is configured for receiving the netlist and transmitting the netlist to the processing circuitry 204. For example, the input device 202 receives the netlist from the GUI where a user uploads the netlist file, and the transmits the received netlist to the processing circuitry 204.

The processing circuitry 204 is configured with a design router 206. The processing circuitry 204 processes the netlist received from the input device 202 and builds non-overlapping routing trees 208 for all nets. The design router 206 employs incremental routing 210, which combines deter-

---

Algorithm 1:
Simplified pseudo code of PathFinder used in VPR 8 tool

---

Input: $N$ set of nets, $I_{M}$ Maximum iterations;
Output: $T$ : routing solution;
$T \leftarrow \emptyset$;
for $i=1 \ldots . I_{M}$ do
   for $N_{i} \in N$ do
      $\rho=T_{i}-\left\{t_{i}^{0}, t_{i}^{1}, \dots, t_{i}^{d_{i}-1}\right\}$
      if $\rho \neq \emptyset$ then
         for each $x \in \rho$ do
         Call Connection-router $C_{0}$ to build a branch
         to $x$ and update $T_{i}$;
         end
      end
   Update the usage and present usage costs;
end
if $T$ is legal then
   return $T$
end
Update historical costs of the nodes, and resize bounding
   boxes of the nets;
for $N_{i} \in N$ do
   $T_{i}=$ Ripup-illegal-connections $\left(T_{i}\right)$;
   $T_{i}=$ Ripup-delay-regraded-connections $\left(T_{i}\right)$;
   end
end
return $\emptyset$;

ministic parallel routing for initial high workload iterations and sequential routing for subsequent iterations.

The design router 206 is configured for building non-overlapping routing trees 208 for all nets. The design router 206 finds a routing tree for each net that connects the source nodes to the sink nodes without exceeding the capacity of the fixed routing resources available on the FPGA. The design router 206 employs a technique known as incremental routing 210, which applies deterministic parallel routing to a window of initial iterations with a high routing workload and sequential routing to the remaining iterations.

The design router 206 within the processing circuitry 204 is configured for dividing the nets into blocks and applying parallel routing to these blocks. In an embodiment, the window of initial iterations is defined as the first four iterations. The window is used for managing the high workload associated with initial routing steps, ensuring efficient and effective processing. For example, during the initial four iterations, the design router 206 handles complex nets that require significant computational resources, and by parallelizing the handling process, the design router 206 speeds up the overall routing time.

In another embodiment, the design router 206 implements a first parallel routing strategy that involves dividing the nets (N) into NP blocks of substantially equal sizes and sequentially routing all nets belonging to each block. Such division allows for efficient load balancing and improved routing performance. For example, if there are 200 nets and 4 processing cores (NP), the design router 206 would divide 200 nets into 4 blocks of 25 nets each, assigning one block to each core for parallel processing.

In this particular embodiment, the parallel routing stage generates an initial routing solution by dividing the set of nets into blocks of nearly equal sizes. The number of parallel processes equals $N_P$, which can be set to the maximum that can be supported by the processor. Each block is assigned to an instance of the connection-router, allowing parallel routing of all blocks. The parallel for-loop indicates that the for-loop in its unrolled form executes in parallel using $N_P$ processes. Each independent process sequentially routes all nets belonging to the assigned block. The worst-case time complexity of this step is $$O\left(\frac{N}{N_P} \times d_{max}\right),$$

where $d_{max}$ is the maximum fanout of any net. Such load-balancing technique has been utilized for speeding up the initial routing process, reducing the need for more complex load-balancing schemes that may incur additional computational overhead.

The first parallel routing state can be implemented using Algorithm 3, as shown below.

---
Algorithm 3:
Parallel routing stage A
---

Input: $N$ set of nets, $N_{P}$ number of parallel processes
Output: $T^{i}$ routing solution (illegal or legal)
$T^{i}=\emptyset$
Uniformly divide the nets among $N_{P}$ blocks,
$B=\left\{B_{0}, B_{1}, \ldots, B_{N_{P}-1}\right\}$
Instantiate $N_{P}$ connection routers, $\left\{C_{0}, C_{1}, \right.$
$\ldots, C_{N_{P}-1}\right\}$
  parallel for $j \in \left\{0,1 \ldots N_{P}-1\right\}$
    for $N_{k} \in B_{j}$ do
      for each $x \in \left\{t_{i}^{0}, \ldots, t_{i}^{d_{i}-1}\right\}$ do
        Call Connection-router $C_{0}$ to build a branch to
        $x$ and update $T_{k}$
      $T^{i}=T^{i} \cup T_{k}$
    return $T^{i}$

---

In another aspect of the embodiment, the design router 206 implements a second parallel routing strategy for handling nets with varying fanout. The design router 206 divides the nets into two sets. First, high fanout nets (CHF), and second, small fanout nets (CLF). High fanout nets are those whose fanout is more than or equal to a predefined threshold value β. The predefined threshold value β is a parameter of the standard PathFinder. Low fanout nets are those whose fanout is lower than or equal to the predefined threshold value β. This strategy is performed for the efficient routing of complex netlists. For example, a net connecting 50 nodes would be classified under CHF, whereas a net connecting to 5 nodes would be classified under CLF.

For the sequential routing process, the design router 206 partitions the nets in CLF into three sets, a set of upper partition (CU), a set of lower partition (CL), and a set of nets overlapping between the upper partition and the lower partition (CLU). CU and CL contain non-overlapping nets, while CLU contains nets that overlap between the partitions CU and CL. The sequential routing process involves routing the union of CHF and CLU using a connection router C0. For instance, if nets in CU and CL are independent, they can be routed separately without interference, whereas nets in CLU are handled with special consideration to avoid conflicts. Subsequently, parallel routing is performed for the nets in CU and CL using two separate and independent threads, with connection routers C0 and C1. The parallel router first rips up the existing routing tree of the net and then completely rebuilds it using the connection router. The worst-case time complexity of parallel routing remains the same as that of sequential routing, due to the unpredictable nature of net overlaps. Overlapping between nets can be determined by $O(Nd_{max})$, where N is the number of nets, and $d_{max}$ is the maximum fanout of any net.

The second parallel routing state can be implemented using Algorithm 4, as shown below.

---
Algorithm 4:
Second parallel routing stage
---

Input: $N$ set of nets, $T^{i}$ current routing solution, $p\{*\}\{\}_{f}$ factor
of present usage cost
Output: $T^{i}$ routing solution
$C_{H F}=\emptyset, C_{L F}=\emptyset$
for $j \in \{0,1, \ldots, |N|-1\}$ do
  if $T_{j} \in T^{i}$ is illegal then
    if $N_{j}$ is a high fanout net then
      $C_{H F}=C_{H F} \cup N_{j}$
    Else $C_{L F}=C_{L F} \cup N_{j}$ -continued Algorithm 4:
Second parallel routing stage Call the net partitioning method to divide $C_{L F}$ into three
    parts: $C_{L}, C_{U}, C_{LU}$
for $N_{k} \in\left\{C_{H F} \cup C_{L U}\right\}$ do
  $\rho=T_{k}-\left\{t_{k}^{0}, t_{k}^{1}, \ldots, t_{k}^{d_{k}-1} \right\}$
  if $\rho \neq \emptyset$ then
    $T^{i}=T^{i}-T_{k}$
    for each $x \in \rho$ do
      Call Connection-router $C_{0}$ to build a branch to
      $x$ and update $T_{k}$
    $T^{i}=T^{i} \cup T_{k}$
parallel do
  for $N_{j} \in C_{U}$ do
    $T^{i}=T^{i}-T_{j}, T_{j}=\emptyset$
    for each $x \in\left\{t_{j}^{0}, \ldots, t_{j}^{d_{i}-1}\right\}$ do
      Call Connection-router $C_{0}$ to build a branch to
      $x$ and update $T_{j}$
    $T^{i}=T^{i} \cup T_{j}$
  for $N_{k} \in C_{L}$ do
    $T^{i}=T^{i}-T_{k}, T_{k}=\emptyset$
    for each $x \in\left\{t_{k}^{0}, \ldots, t_{k}^{d_{i}-1} \right\}$ do
      Call Connection-router $C_{1}$ to build a branch to
      $x$ and update $T_{k}$
    $T^{i}=T^{i} \cup T_{k}$
return $T^{i}$ The design router 206, in one aspect, applies a net partitioning technique. The design router 206 finds a cutline that separates the nets into upper and lower halves based on their bounding boxes while ensuring that each partition has nearly equal number of branches to route.

The net partitioning technique divides the nets into three sets, CU, CL, and CLU. The design router 206 identifies the cutline. The design router 206 is further configured to fill two arrays, "Workload-before" and "Workload-after," with the number of sinks of the nets. The vertical axis of the cutline is determined by identifying the index where the one-to-one difference between the elements of "Workload-after" and "Workload-before" is minimal. After finding the cutline, nets whose bounding boxes lie entirely on the upper side of the cutline are inserted into CU, while nets whose bounding boxes lie entirely on the lower side are placed into CL. Nets whose bounding boxes cross the cutline are inserted into CLU. This net partitioning method has a time complexity of $O(N+W_Y)$, where N represents the number of nets, and $W_Y$ is the height of the FPGA.

The step of finding the optimal horizontal cutline is implemented based on Algorithm 5, as shown below:

Algorithm 5:
Net partitioning method

Input: $N$ set of nets, $B$ bounding boxes of the nets, $C_{L F}$
a subset of nets
Output: $\left\{C_{U}, C_{L}, C_{A}\right\}$ three subsets of nets
Workload-before, Workload-after $=[0,0, \ldots]$
for $N_{j} \in C_{L F}$ do
  if $B\left[N_{j}\right] \cdot y_{\max}=i$ then
    Workload-before $\left[B\left[N_{j}\right] \cdot y_{\text{max}}\right]+=d_{i}$
  if $B\left[N_{j}\right] \cdot y_{\text{min}}=i$ then
    Workload-after $\left[B\left[N_{j}\right] \cdot y_{\text{min}}\right]+=d_{i}$
for $i=\left\{1, \ldots, W_{Y}-1\right\}$ do
  Workload-before $[i]+=$ Workload-before $[i-1]$
for $i=\left\{W_{Y}-2, \ldots, 0\right\}$ do
  Workload-after $[i]+=$ Workload-after $[i+1]$
$I=\quad \operatorname{argmin} \quad (\mid$ workload-before$[i]$ - workload-after$[i]\mid)$
  $i \in\left\{0, \ldots W_{Y}-1\right\}$
  13 $C_{U}=\left\{N_{i} \in C_{L F}\right.$, s.t. $B\left[N_{i}\right] \cdot y_{\min} \geq I$
  14 $C_{L}=\left\{N_{i} \in C_{L F} \right.$, s.t. $B\left[N_{i}\right] . y_{\max} \leq I$
  15 $C_{A}=C_{L F}-\left\{C_{U} \cup C_{L}\right\}$
  16 return $\left\{C_{U}, C_{L}, C_{A}\right\}$ The FPGA routing tool 200 further includes a display device 212. The display device 212 is configured to continuously display the interconnections and routing utilization while the routing trees are being determined. This real-time visualization aids in monitoring the routing progress and identifying any potential issues that may arise during the routing process. For example, the display device 212 could show a heatmap indicating areas of high congestion, allowing designers to intervene and make the adjustments.

Various experiments can be conducted on the FPGA routing tool 200 for verification and validation. In one particular experimental setup, the FPGA routing tool 200 is implemented in the PathFinder of VPR 8.0, which can be downloaded from a Github repository. The notations "VPR 8.0 (std)" and "VPR 8.0 (hybrid)" are used to denote the results obtained using the standard PathFinder and the proposed serial-parallel hybrid PathFinder, respectively. The execution platform can include a desktop computer or a computing system equipped with an Intel $11^{th}$ generation i5 core processor featuring six cores, 64 GB of memory, and running the Ubuntu 22.04 operating system. For purposes of verification and validation, all results can be obtained using this execution platform.

The experiments are conducted using the Titan benchmarks, which consist of twenty-three problems. Out of these, twenty-one problems are solvable by VPR. Therefore, twenty-one routable problems from the Titan benchmarks are used. For each problem, up to ten different placements are generated using seeds. Both the proposed and standard PathFinder are then used to solve these placements at channel widths equal to the minimal value found by the VPR tool.

An implementation of the disclosed router utilizes specific parameters, including K=4, $I_M$=500, po=2, $\Delta p$=1.1, $p^*_o$=1, and $\Delta p^*$=1.1. These values were chosen after extensive testing of several possible values to achieve a good speedup with minimal degradation in solution quality. The standard PathFinder (VPR 8.0 (std)) was also executed with its default parameters.

By implementing the experimental setup, the FPGA routing tool 200 can be tested and the results are described with reference to FIG. 3A and FIG. 3B.

Figure 3A:
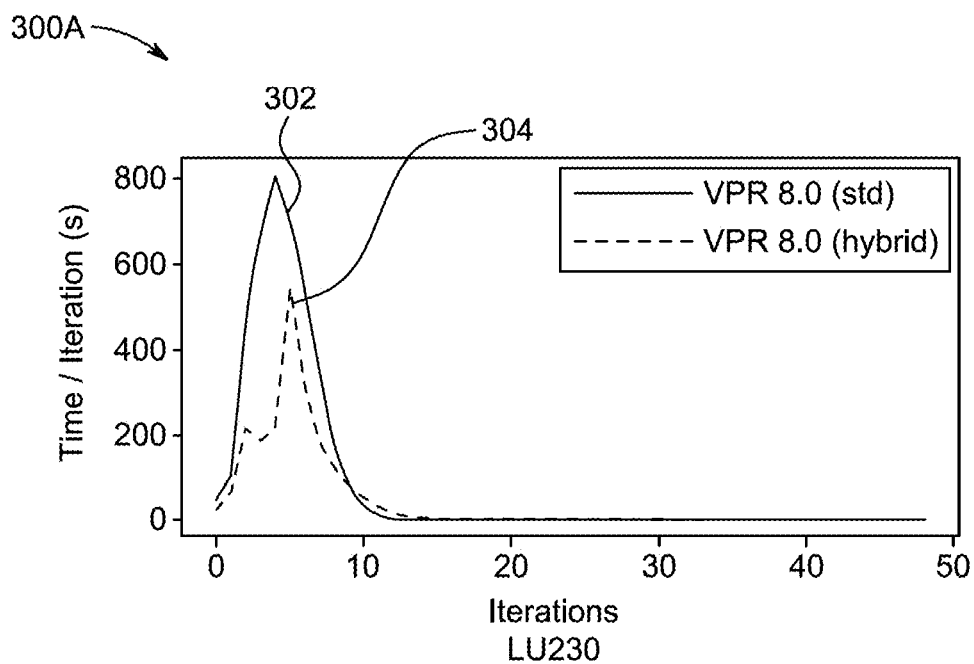
FIG. 3A illustrates a graphical representation of the time/iteration of the VTR 8.0 (std) and VTR 8.0 (hybrid) in solving LU230 problem, according to certain embodiments.

FIG. 3A is a graphical representation of the time/iteration of the VTR 8.0 (std) and VTR 8.0 (hybrid) in solving LU230 problem of from the Titan Benchmark. Implementation of the hybrid router is stored in a GitHub repository and can be tested on a desktop computer equipped with an Intel 11th generation i5 core processor featuring six cores, 64 GB of memory, and running the Ubuntu 22.04 operating system. The notation "VPR 8.0 (std)" is used to refer to the results obtained using the standard PathFinder, while "VPR 8.0 (hybrid)" denotes the results from the proposed serial-parallel hybrid PathFinder.

The experiments can be conducted using the Titan benchmarks, which includes a suite of 23 problems, of which 21 are routable by VPR. For each problem, up to ten different placements are generated using seeds. Both the disclosed and standard PathFinder can be tested at channel widths equal to the minimal value found by the VPR tool. The implementation of the disclosed router utilizes parameters K=4, $I_M$=500, po=2, $\Delta p$=1.1, $p^*_o$=1, and $\Delta p^*$=1.1. These values are selected after extensive testing to produce a good speedup with minimal degradation in solution quality. The standard PathFinder (VPR 8.0 (std)) is executed with its default parameters.

Figure 3B:
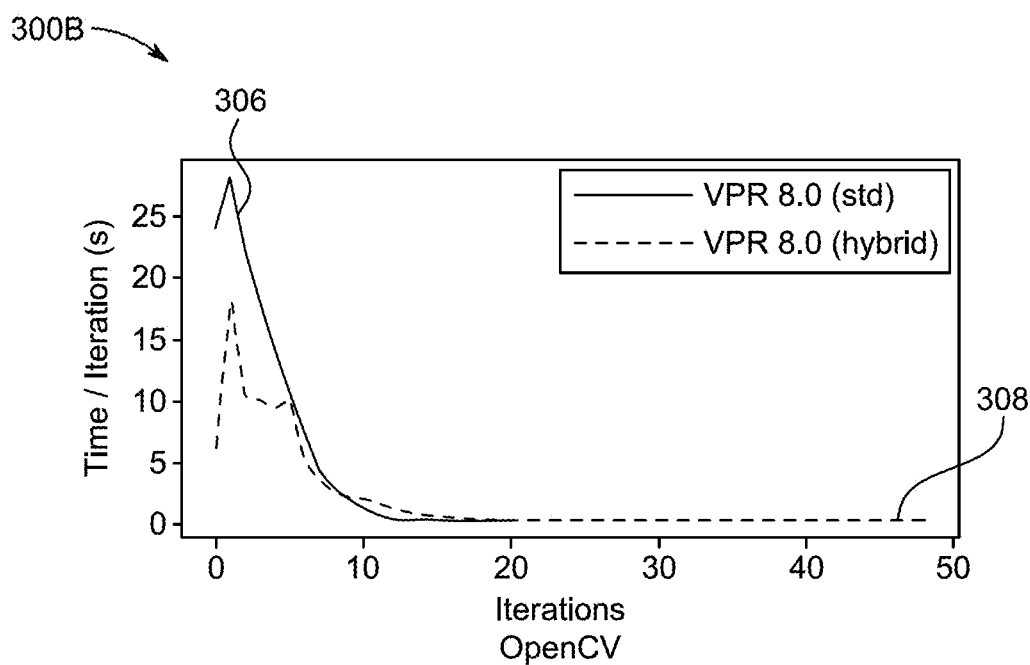
FIG. 3B illustrates a graphical representation of the time/iteration of the VTR 8.0 (std) and VTR 8.0 (hybrid) in solving OpenCV problem, according to certain embodiments.

FIG. 3B is a graphical representation of the time/iteration of the VTR 8.0 (std) and VTR 8.0 (hybrid) in solving the OpenCV problem of the Titan Benchmark. The graph 300B illustrates the runtime of VPR 8.0 (std) and VPR 8.0 (hybrid) in solving two problems from the Titan benchmarks. Curve 306 represents the runtime of VPR 8.0 (std), showing that the initial iterations have higher runtimes. Curve 308 represents the runtime of VPR 8.0 (hybrid), demonstrating that the introduction of parallel routing in the initial iterations effectively reduces the runtimes. The application of parallel routing in the hybrid approach significantly improves the runtime during the initial iterations, which are the most computationally intensive phases. Conversely, the later iterations of VPR 8.0 (std) already exhibit smaller runtimes, making the application of parallel routing to these iterations less beneficial. This performance enhancement underscores the efficacy of the hybrid approach in optimizing the routing process during the most computationally intensive phases, thereby substantially improving the overall runtime.

Based on the experimental results, the FPGA routing tool 200 is compared with a standard VPR known in the art. The comparative analysis is described below.

Table I presents the overall collective results, aggregating all trials across all problems. The results demonstrate that VPR 8.0 (hybrid) is 31.9% faster than VPR 8.0 (std). However, the wire length and critical path delay (CPD) of VPR 8.0 (hybrid) are only 0.92% and 0.12% greater, respectively, compared to VPR 8.0 (std).

TABLE I

OVERALL COLLECTIVE RESULTS OF
ALL PROBLEMS OF THE TITAN BENCHMARKS

| quantity | VPR 8.0 (std) | VPR 8.0 (hybrid) | fold change (% improvement) |
|---|---|---|---|
| runtime | 99532.52 | 67793.75 | 0.68 (31.90%) |
| wire-length | 854051504 | 861885355 | 1.009 (0.92%) |
| CPD | 19820.58 | 19844.06 | 1.001 (−0.12%) |

Table II provides the detailed runtime results for both VPR 8.0 (std) and VPR 8.0 (hybrid). The terms "mean" and "c.var" refer to the mean and coefficient of variance over ten trials. The results indicate that VPR 8.0 (hybrid) outperforms VPR 8.0 (std) in 18 out of 21 problems, with improvements ranging from 13% to 42%. For three problems, VPR 8.0 (hybrid) takes slightly longer than VPR 8.0 (std). These problems are not time-intensive, and the increase in runtime is only up to 10%.

TABLE II

PROBLEM-WISE RUNTIME RESULTS ON THE TITAN BENCHMARKS

| problem | VPR 8.0 (std) mean (s) (c.var) | VPR 8.0 (hybrid) mean (s) (c.var) | fold change (% improvement) |
|---|---|---|---|
| neuron | 50.93 (0.12) | 39.8 (0.14) | 0.781 (21.864%) |
| sparcT1_core | 79.97 (0.17) | 66.97 (0.23) | 0.837 (16.265%) |
| stereo_vision | 16.99 (0.05) | 13.53 (0.08) | 0.796 (20.41%) |

TABLE II-continued

PROBLEM-WISE RUNTIME RESULTS ON THE TITAN BENCHMARKS

| | problem | | |
|---|---|---|---|
| | VPR 8.0 (std) mean (s) (c.var) | VPR 8.0 (hybrid) mean (s) (c.var) | fold change (% improvement) |
| cholesky_mc | 86.37 (0.07) | 67.76 (0.05) | 0.785 (21.548%) |
| des90 | 84.19 (0.07) | 60.81 (0.12) | 0.722 (27.769%) |
| sparcT1_chip2 | 274.94 (0.13) | 238.46 (0.16) | 0.867 (13.269%) |
| bitcoin_miner | 276.68 (0.07) | 207.72 (0.08) | 0.751 (24.924%) |
| sparcT2_core | 185.17 (0.31) | 131.27 (0.34) | 0.709 (29.11%) |
| stap_qrd | 203.8 (0.18) | 141.11 (0.14) | 0.692 (30.76%) |
| segmentation | 121.91 (0.18) | 134.63 (0.18) | 1.104 (−10.43%) |
| bitonic_mesh | 315.94 (0.18) | 255.18 (0.24) | 0.808 (19.234%) |
| cholesky_bdti | 409.44 (0.13) | 287.47 (0.16) | 0.702 (29.79%) |
| dart | 99.95 (0.08) | 89.9 (0.08) | 0.9 (10.047%) |
| denoise | 190.45 (0.22) | 204.1 (0.19) | 1.072 (−7.164%) |
| gsm_switch | 2571.86 (0.13) | 1624.06 (0.16) | 0.631 (36.853%) |
| LU230 | 3956.58 (0.49) | 2289.36 (0.42) | 0.579 (42.138%) |
| LU_Network | 267.7 (0.17) | 232.41 (0.2) | 0.868 (13.183%) |
| mes_noc | 252.47 (0.18) | 210.77 (0.21) | 0.835 (16.52%) |
| minres | 319.91 (0.28) | 346.3 (0.32) | 1.082 (−8.248%) |
| openCV | 176.24 (0.19) | 114.17 (0.17) | 0.648 (35.217%) |
| SLAM_spheric | 168.43 (0.22) | 143.05 (0.25) | 0.849 (15.068%) |

Specifically, for the two problems, "gsm_switch" and "LU230," where the mean runtimes using VPR 8.0 (std) exceed 30 minutes, VPR 8.0 (hybrid) reduces their runtime by up to 37% and 42%, respectively. Tables III and IV show that the increase in wire length and CPD is up to 1.45% and 2.8%, respectively. Although the percentage increase in CPD values appears significant, the absolute increase is less than one nanosecond in all cases.

TABLE III

PROBLEM-WISE WIRE-LENGTH RESULTS ON THE TITAN BENCHMARKS problem

| | VPR 8.0 (std) mean (1e6) (c.var) | VPR 8.0 (hybrid) mean (1e6) (c.var) | fold change (% improvement) |
|---|---|---|---|
| neuron | 8.24 (0.02) | 8.31 (0.02) | 1.01 (−0.86%) |
| sparcT1_core | 13.23 (0.02) | 13.26 (0.02) | 1.0 (−0.26%) |
| stereo_vision | 6.07 (0.02) | 6.12 (0.02) | 1.01 (−0.89%) |
| cholesky_mc | 12.12 (0.01) | 12.18 (0.01) | 1.01 (−0.51%) |
| des90 | 22.01 (0.02) | 22.08 (0.03) | 1.0 (−0.33%) |
| sparcT1_chip2 | 78.62 (0.01) | 79.17 (0.01) | 1.01 (−0.7%) |

TABLE III-continued

PROBLEM-WISE WIRE-LENGTH RESULTS ON THE TITAN BENCHMARKS problem

| | VPR 8.0 (std) mean (1e6) (c.var) | VPR 8.0 (hybrid) mean (1e6) (c.var) | fold change (% improvement) |
|---|---|---|---|
| bitcoin_miner | 103.9 (0.01) | 104.55 (0.01) | 1.01 (−0.62%) |
| sparcT2_core | 46.77 (0.02) | 47.39 (0.02) | 1.01 (−1.32%) |
| stap_qrd | 27.59 (0.02) | 27.93 (0.02) | 1.01 (−1.25%) |
| segmentation | 18.3 (0.02) | 18.39 (0.01) | 1.0 (−0.48%) |
| bitonic_mesh | 49.01 (0.03) | 49.16 (0.02) | 1.0 (−0.31%) |
| cholesky_bdti | 27.94 (0.01) | 28.09 (0.01) | 1.01 (−0.52%) |
| dart | 23.02 (0.01) | 23.2 (0.01) | 1.01 (−0.79%) |
| denoise | 32.03 (0.02) | 32.33 (0.02) | 1.01 (−0.94%) |
| gsm_switch | 57.42 (0.01) | 58.13 (0.01) | 1.01 (−1.24%) |
| LU230 | 181.59 (0.01) | 183.51 (0.01) | 1.01 (−1.06%) |
| LU_Network | 62.57 (0.02) | 63.48 (0.02) | 1.01 (−1.46%) |
| mes_noc | 50.83 (0.01) | 51.29 (0.02) | 1.01 (−0.9%) |
| minres | 30.3 (0.01) | 30.73 (0.01) | 1.01 (−1.4%) |
| openCV | 34.0 (0.02) | 34.27 (0.02) | 1.01 (−0.82%) |
| SLAM_spheric | 16.99 (0.03) | 17.13 (0.02) | 1.01 (−0.85%) |

TABLE IV

PROBLEM-WISE CPD RESULTS ON THE TITAN BENCHMARKS

| | problem | | |
|---|---|---|---|
| | VPR 8.0 (std) mean (ns) (c.var) | VPR 8.0 (hybrid) mean (ns) (c.var) | fold change (% improvement) |
| neuron | 8.41 (0.03) | 8.58 (0.03) | 1.02 (−2.025%) |
| sparcT1_core | 8.99 (0.04) | 8.89 (0.03) | 0.988 (1.196%) |
| stereo_vision | 7.7 (0.06) | 7.48 (0.03) | 0.972 (2.816%) |
| cholesky_mc | 7.42 (0.05) | 7.56 (0.04) | 1.02 (−2.002%) |
| des90 | 12.07 (0.03) | 12.32 (0.02) | 1.02 (−2.029%) |
| sparcT1_chip2 | 17.75 (0.08) | 17.99 (0.08) | 1.014 (−1.379%) |
| bitcoin_miner | 8.18 (0.03) | 8.37 (0.03) | 1.023 (−2.284%) |
| sparcT2_core | 11.68 (0.04) | 11.82 (0.03) | 1.012 (−1.225%) |
| stap_qrd | 7.8 (0.04) | 7.9 (0.05) | 1.012 (−1.221%) |
| segmentation | 850.91 (0.01) | 1850.77 (0.01) | 1.0 (0.016%) |
| bitonic_mesh | 13.87 (0.05) | 14.1 (0.05) | 1.016 (−1.649%) |
| cholesky_bdti | 9.03 (0.02) | 9.48 (0.03) | 1.05 (−4.95%) |
| dart | 14.94 (0.04) | 14.88 (0.04) | 0.996 (0.404%) |

TABLE IV-continued

PROBLEM-WISE CPD RESULTS ON THE TITAN BENCHMARKS

| problem | VPR 8.0 (std) mean (ns) (c.var) | VPR 8.0 (hybrid) mean (ns) (c.var) | fold change (% improvement) |
|---|---|---|---|
| denoise | 860.6 (0.01) | 860.64 (0.01) | 1.0 (−0.005%) |
| gsm_switch | 8.91 (0.09) | 8.91 (0.09) | 1.0 (−0.041%) |
| LU230 | 22.8 (0.01) | 22.83 (0.01) | 1.001 (−0.126%) |
| LU_Network | 9.7 (0.12) | 9.72 (0.12) | 1.001 (−0.135%) |
| mes_noc | 12.17 (0.08) | 12.65 (0.07) | 1.04 (−3.982%) |
| minres | 8.78 (0.13) | 8.74 (0.23) | 0.995 (0.508%) |
| openCV | 10.6 (0.04) | 10.73 (0.04) | 1.012 (−1.22%) |
| SLAM_spheric | 80.21 (0.01) | 80.6 (0.01) | 1.005 (−0.488%) |

In summary, the present disclosure introduces a parallel-sequential hybrid field-programmable gate array (FPGA) router, utilizing the Adaptive Incremental Routing (AIR) method, incorporated within the Versatile Place and Route (VPR) 8.0 tool. The AIR method incorporates incremental routing that involves extensive routing tasks during initial iterations, characterized by a high workload due to the necessity to construct numerous branches using the connection router. It has been determined that enhancing the speed of these initial iterations through the application of deterministic parallel routing to a designated window of initial iterations significantly improves the overall runtime of the routing process. Following this initial phase, routing is conducted sequentially.

Evaluative experiments conducted using the Titan benchmarks demonstrate that the hybrid router can enhance the routing speed of the AIR method by up to 32%. Future efforts are aimed at further advancements of this technology to achieve even greater efficiencies and speed reductions in the routing process. These developments underscore the innovative approach of the hybrid routing technique in enhancing the performance of FPGA routing.

Figure 4:
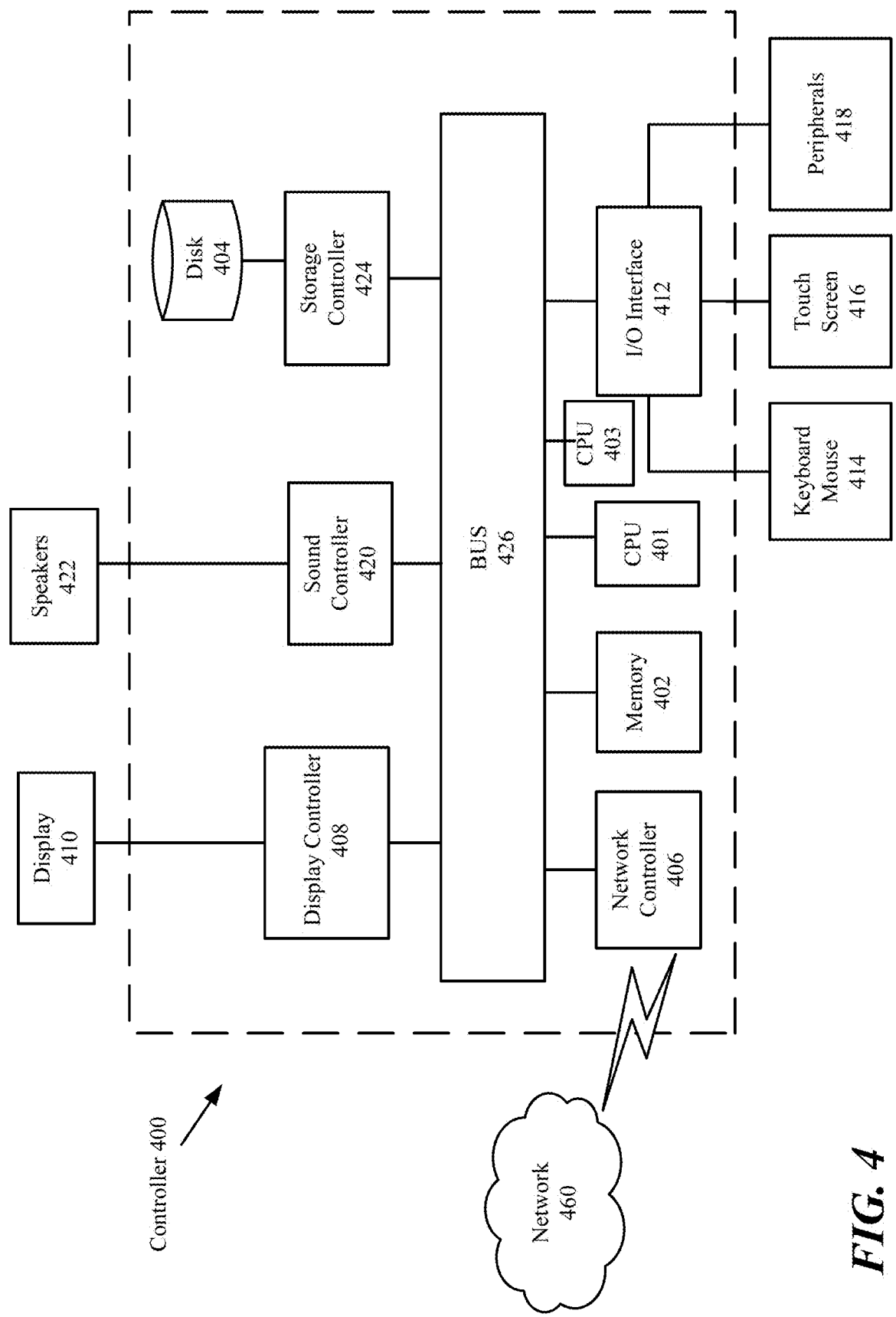
FIG. 4 is an illustration of a non-limiting example of details of computing hardware used in the computing system, according to certain embodiments.

Next, further details of the hardware description of the computing environment of FIG. 2 according to exemplary embodiments is described with reference to FIG. 4. In FIG. 4, a controller 400 is described which can implement the FPGA routing tool 200 of FIG. 2 in which the controller is a computing device which includes a CPU 401 which performs the processes described herein. The process data and instructions may be stored in memory 402. These processes and instructions may also be stored on a storage medium disk 404 such as a hard drive (HDD) or portable storage medium or may be stored remotely.

Further, the disclosed router is not limited by the form of the computer-readable media on which the instructions of the inventive process are stored. For example, the instructions may be stored on CDs, DVDs, in FLASH memory, RAM, ROM, PROM, EPROM, EEPROM, hard disk or any other information processing device with which the computing device communicates, such as a server or computer.

Further, the disclosed router may be provided as a utility application, background daemon, or component of an operating system, or combination thereof, executing in conjunction with CPU 401, 403 and an operating system such as Microsoft Windows 11, UNIX, Solaris, LINUX, Apple MAC-OS and other systems known to those skilled in the art.

The hardware elements in order to achieve the computing device may be realized by various circuitry elements, known to those skilled in the art. For example, CPU 401 or CPU 403 may be a Xenon or Multiple Core processor from Intel of America or an Opteron processor from AMD of America, or may be other processor types that would be recognized by one of ordinary skill in the art. Alternatively, the CPU 401, 403 may be implemented on an FPGA, ASIC, PLD or using discrete logic circuits, as one of ordinary skill in the art would recognize. Further, CPU 401, 403 may be implemented as multiple processors cooperatively working in parallel to perform the instructions of the inventive processes described above.

The computing device in FIG. 4 also includes a network controller 406, such as an Intel Ethernet PRO network interface card from Intel Corporation of America, for interfacing with network 460. As can be appreciated, the network 460 can be a public network, such as the Internet, or a private network such as an LAN or WAN network, or any combination thereof and can also include PSTN or ISDN subnetworks. The network 460 can also be wired, such as an Ethernet network, or can be wireless such as a cellular network including EDGE, 3G, 4G and 5G wireless cellular systems. The wireless network can also be WiFi, Bluetooth, or any other wireless form of communication that is known.

The computing device further includes a display controller 408, such as a NVIDIA GeForce RTX or Quadro graphics adaptor from NVIDIA Corporation of America for interfacing with display 410, such as a Hewlett Packard HP LCD monitor. A general purpose I/O interface 412 interfaces with a keyboard and/or mouse 414 as well as a touch screen panel 416 on or separate from display 410. General purpose I/O interface also connects to a variety of peripherals 418 including printers and scanners, such as an OfficeJet or DeskJet from Hewlett Packard.

A sound controller 420 is also provided in the computing device such as Sound Blaster X-Fi Titanium from Creative, to interface with speakers/microphone 422 thereby providing sounds and/or music.

The general purpose storage controller 424 connects the storage medium disk 404 with communication bus 426, which may be an ISA, EISA, VESA, PCI, or similar, for interconnecting all of the components of the computing device. A description of the general features and functionality of the display 410, keyboard and/or mouse 414, as well as the display controller 408, storage controller 424, network controller 406, sound controller 420, and general purpose I/O interface 412 is omitted herein for brevity as these features are known.

The exemplary circuit elements described in the context of the present disclosure may be replaced with other elements and structured differently than the examples provided herein. Moreover, circuitry configured to perform features described herein may be implemented in multiple circuit units (e.g., chips), or the features may be combined in circuitry on a single chipset, as shown on FIG. 5.

Figure 5:
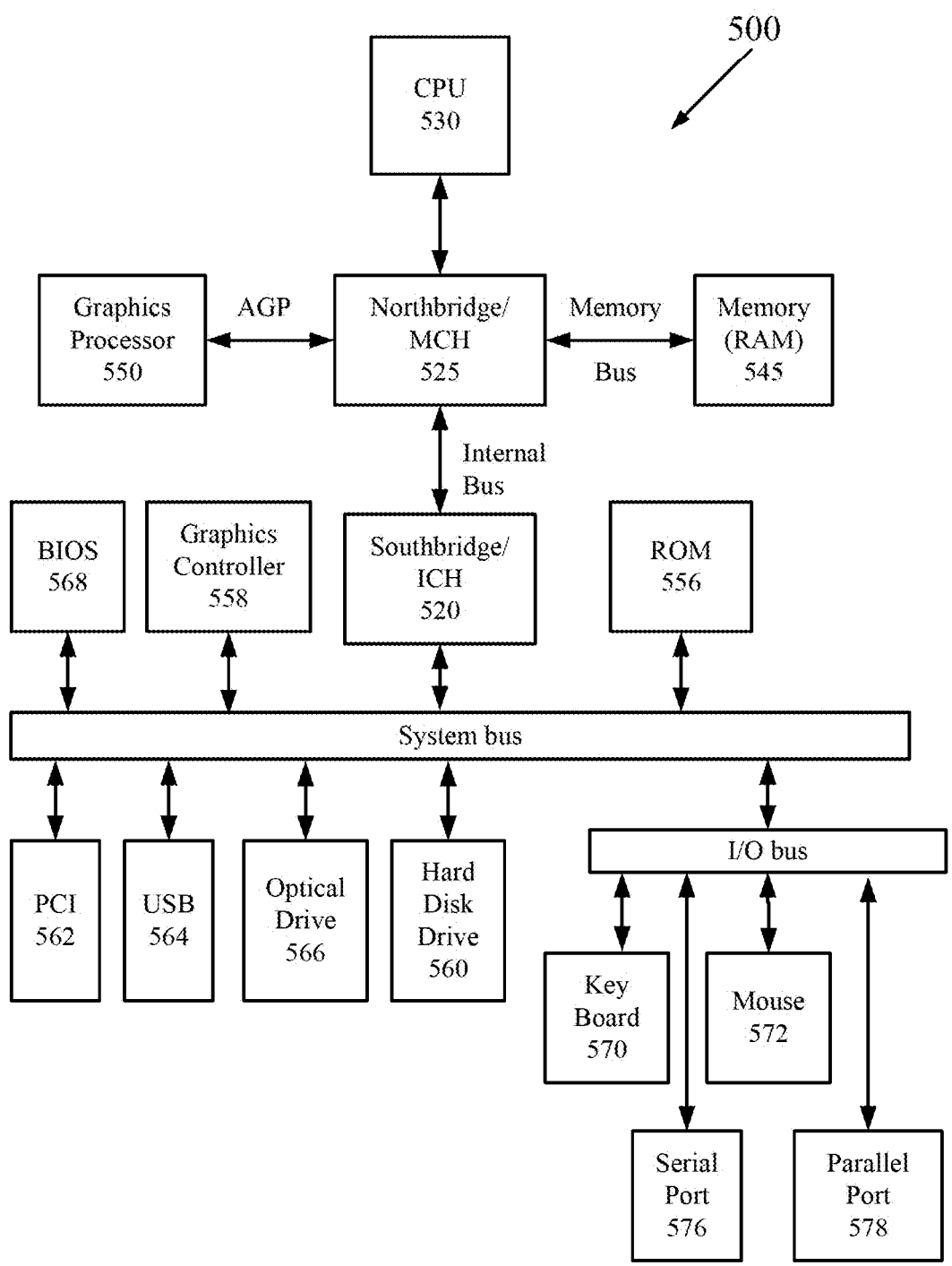
FIG. 5 is an exemplary schematic diagram of a data processing system used within the computing system, according to certain embodiments.

FIG. 5 shows a schematic diagram of a data processing system, according to certain embodiments, for performing the functions of the exemplary embodiments. The data processing system is an example of a computer in which code or instructions implementing the processes of the illustrative embodiments may be located.

In FIG. 5, data processing system 500 employs a hub architecture including a north bridge and memory controller hub (NB/MCH) 525 and a south bridge and input/output (I/O) controller hub (SB/ICH) 520. The central processing unit (CPU) 530 is connected to NB/MCH 525. The NB/MCH 525 also connects to the memory 545 via a memory bus, and connects to the graphics processor 550 via an accelerated graphics port (AGP). The NB/MCH 525 also connects to the SB/ICH 520 via an internal bus (e.g., a unified media interface or a direct media interface). The CPU Processing unit 530 may contain one or more processors and even may be implemented using one or more heterogeneous processor systems.

Figure 6:
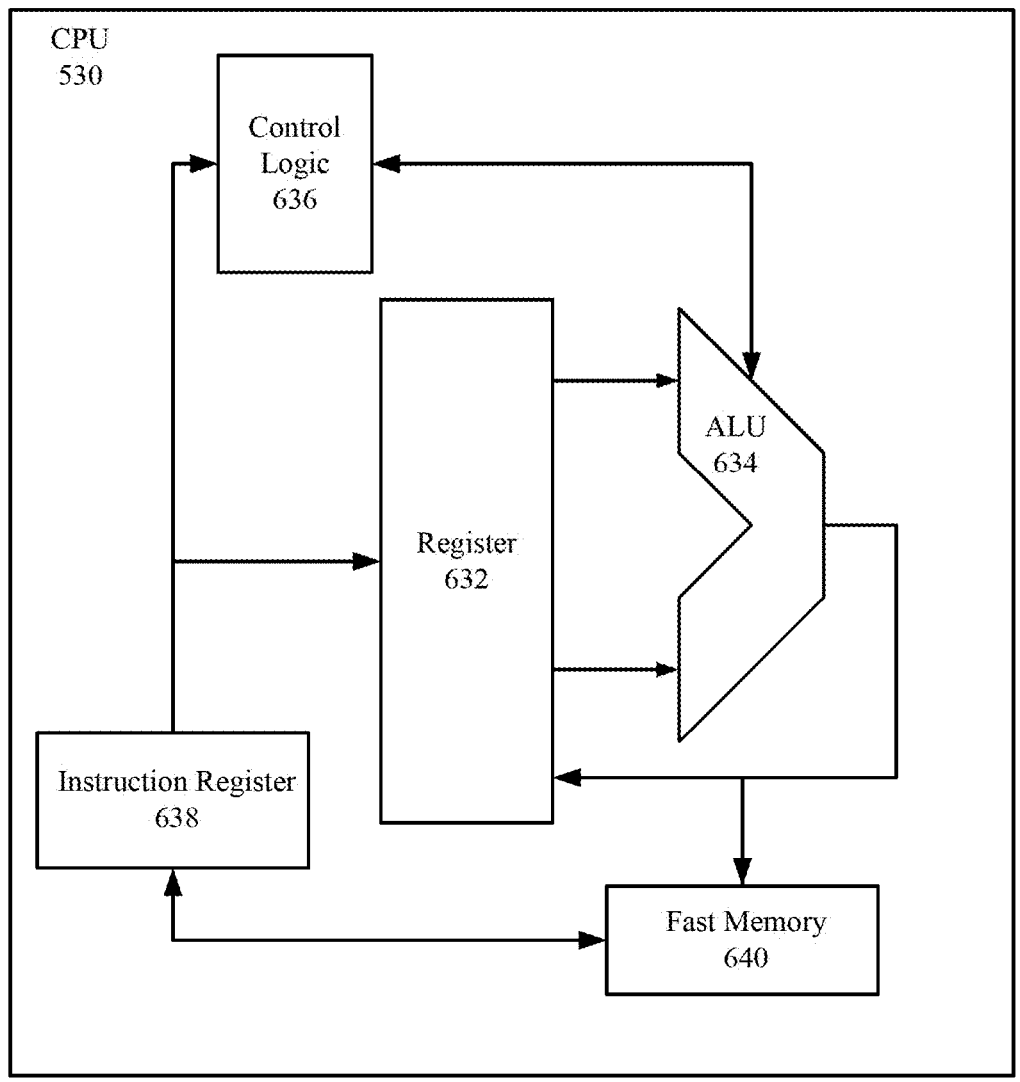
FIG. 6 is an exemplary schematic diagram of a processor used with the computing system, according to certain embodiments.

For example, FIG. 6 shows one implementation of CPU 530. In one implementation, the instruction register 638 retrieves instructions from the fast memory 640. At least part of these instructions are fetched from the instruction register 638 by the control logic 636 and interpreted according to the instruction set architecture of the CPU 530. Part of the instructions can also be directed to the register 632. In one implementation the instructions are decoded according to a hardwired method, and in another implementation the instructions are decoded according a microprogram that translates instructions into sets of CPU configuration signals that are applied sequentially over multiple clock pulses. After fetching and decoding the instructions, the instructions are executed using the arithmetic logic unit (ALU) 634 that loads values from the register 632 and performs logical and mathematical operations on the loaded values according to the instructions. The results from these operations can be feedback into the register and/or stored in the fast memory 640. According to certain implementations, the instruction set architecture of the CPU 530 can use a reduced instruction set architecture, a complex instruction set architecture, a vector processor architecture, a very large instruction word architecture. Furthermore, the CPU 530 can be based on the Von Neuman model or the Harvard model. The CPU 530 can be a digital signal processor, an FPGA, an ASIC, a PLA, a PLD, or a CPLD. Further, the CPU 530 can be an x86 processor by Intel or by AMD; an ARM processor, a Power architecture processor by, e.g., IBM; a SPARC architecture processor by Sun Microsystems or by Oracle; or other known CPU architecture.

Referring again to FIG. 5, the data processing system 500 can include that the SB/ICH 520 is coupled through a system bus to an I/O Bus, a read only memory (ROM) 556, universal serial bus (USB) port 564, a flash binary input/output system (BIOS) 568, and a graphics controller 558. PCI/PCIe devices can also be coupled to SB/ICH 588 through a PCI bus 562.

The PCI devices may include, for example, Ethernet adapters, add-in cards, and PC cards for notebook computers. The Hard disk drive 560 and CD-ROM 566 can use, for example, an integrated drive electronics (IDE) or serial advanced technology attachment (SATA) interface. In one implementation the I/O bus can include a super I/O (SIO) device.

Further, the hard disk drive (HDD) 560 and optical drive 566 can also be coupled to the SB/ICH 520 through a system bus. In one implementation, a keyboard 570, a mouse 572, a parallel port 578, and a serial port 576 can be connected to the system bus through the I/O bus. Other peripherals and devices that can be connected to the SB/ICH 520 using a mass storage controller such as SATA or PATA, an Ethernet port, an ISA bus, a LPC bridge, SMBus, a DMA controller, and an Audio Codec.

Moreover, the present disclosure is not limited to the specific circuit elements described herein, nor is the present disclosure limited to the specific sizing and classification of these elements. For example, the skilled artisan will appreciate that the circuitry described herein may be adapted based on changes on battery sizing and chemistry, or based on the requirements of the intended back-up load to be powered.

Figure 7:
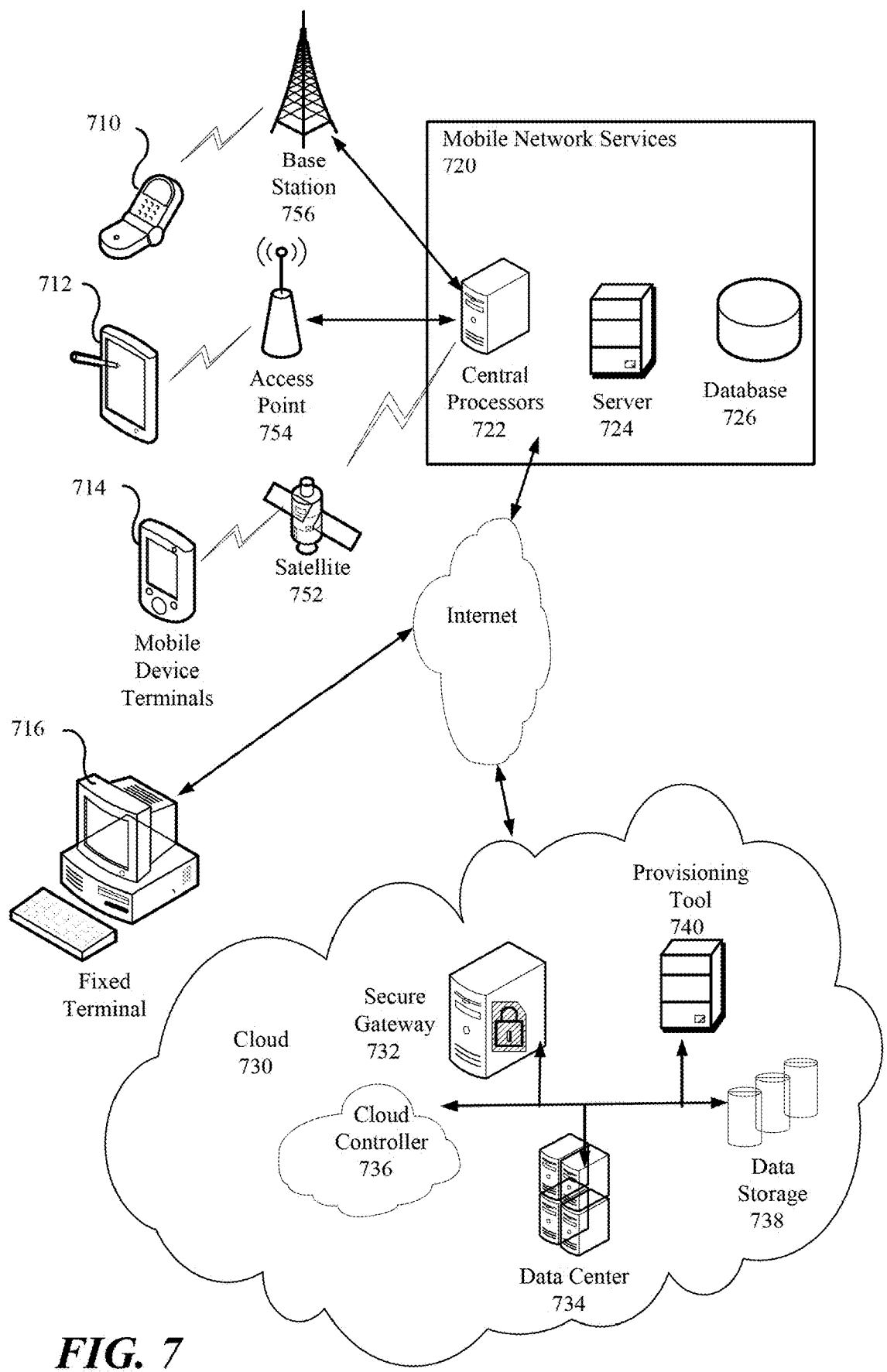
FIG. 7 is an illustration of a non-limiting example of distributed components which may share processing with the controller, according to certain embodiments.

The functions and features described herein may also be executed by various distributed components of a system. For example, one or more processors may execute these system functions, wherein the processors are distributed across multiple components communicating in a network. The distributed components may include one or more client 716 and server machines 722, 724, which may share processing, as shown by FIG. 7 in addition to various human interface and communication devices (e.g., cellular phones 710 via base station 756, smart phones 714 via satellite 752, tablets 712 via access point 754, personal digital assistants (PDAs)) via mobile network services 720 and database 726. The network may be a private network, such as a LAN or WAN, or may be a public network, such as the Internet (Cloud 730, secure gateway 732, data center 734, cloud controller 736, data storage 738, provisioning tool 740). Input to the system may be received via direct user input and received remotely either in real-time or as a batch process. Additionally, some implementations may be performed on modules or hardware not identical to those described. Accordingly, other implementations are within the scope of the disclosure.

The above-described hardware description is a non-limiting example of corresponding structure for performing the functionality described herein.

Numerous modifications and variations of the present disclosure are possible in light of the above teachings. It is therefore to be understood that the invention may be practiced otherwise than as specifically described herein.

The invention claimed is:

1. A field programmable gate array (FPGA) routing tool in a computer-aided design system, comprising:
   an input device for receiving a netlist having nets with source nodes, sink nodes, and a plurality of intermediate nodes at fixed positions; and
   processing circuitry configured with
   a design router for building non-overlapping routing trees for all nets, including finding a routing tree for each net that connects the source nodes to the sink nodes without exceeding a capacity of fixed routing resources available on the FPGA;
   the design router with incremental routing that:
      applies deterministic parallel routing to a window of initial iterations having a high routing workload, where the window of initial iterations covers a range from a first iteration to an i-th iteration, and
      applies sequential routing to all iterations after the i-th iteration; and
   a display device to continuously display interconnections and a routing utilization while the routing trees are being determined.

2. The routing tool of claim 1, wherein the window of initial iterations is a window of first K iterations, where K is a positive integer smaller than a predefined threshold.

3. The routing tool of claim 1, wherein the design router applies parallel routing that includes
divide the nets (N) into $N_P$ blocks of substantially equal sizes; and
sequentially route all nets belonging to the block assigned to it.

4. The routing tool of claim 3, wherein the design router applies parallel routing that further includes
divide the nets into two sets: $C_{HF}$, and $C_{LF}$, where $C_{HF}$ contains the nets having high fanout and $C_{LF}$ contains the nets having small fanout, wherein the high fanout nets are those nets whose fanout is more than or equal to a fanout threshold value.

5. The routing tool of claim 4, wherein the design router applies the sequential routing that includes
partition the nets in $C_{LF}$ into three sets: $C_U$, $C_L$, and $C_{LU}$, where $C_U$ and $C_L$ contain non-overlapping nets, and $C_{LU}$ contains nets that lie in both partitions $C_U$ and $C_L$, and
perform sequential routing of nets in a union of $\{C_{HF}$ and $C_{LU}\}$ using a connection router $C_0$.

6. The routing tool of claim 5, wherein the design router applies net partitioning that includes
find a cutline that separates the nets into upper and lower halves based on their bounding boxes while ensuring that each partition has nearly equal number of branches to route.

7. The routing tool of claim 6, wherein the design router applies net partitioning that includes
find the cutline's vertical axis, denoted by I, which is equal to an index where one-to-one difference between elements of an array "Workload-after" and an array "Workload-before" is minima.

8. The routing tool of claim 7, wherein the design router applies net partitioning that includes
insert all nets whose bounding boxes lie completely on an upper side of the cutline into $C_U$, and the nets whose bounding boxes lie on a lower side of the cutline into $C_L$, and the nets whose bounding boxes crosses the cutline are inserted in $C_{LU}$.

9. A non-transitory computer-readable storage medium including computer executable instructions, wherein the instructions, when executed by a computer, cause the computer to perform a method for routing a field programmable gate array (FPGA) by a routing tool in a computer-aided design system, the method comprising:
receiving, by an input device, a netlist having nets with source nodes, sink nodes, and a plurality of intermediate nodes at fixed positions; and
building, by processing circuitry, non-overlapping routing trees for all nets, including determining a routing tree for each net that connects the source nodes to the sink nodes without exceeding a capacity of fixed routing resources available on the FPGA;
applying, by the processing circuitry, deterministic parallel routing to a window of initial iterations having a high routing workload, where the window of initial iterations covers a range from a first iteration to an i-th iteration, and applying sequential routing to all iterations after the i-th iteration; and
continuously displaying, by a display device, a interconnections and a routing utilization while the routing trees are being determined.

10. The non-transitory computer-readable storage medium of claim 9, wherein the window of initial iterations is a window of first K iterations, where K is a positive integer smaller than a predefined threshold.

11. The non-transitory computer-readable storage medium of claim 9, wherein the applying parallel routing that includes
dividing the nets (N) into $N_P$ blocks of substantially equal sizes; and
sequentially routing all nets belonging to the block assigned to it.

12. The non-transitory computer-readable storage medium of claim 11, wherein the applying parallel routing that further includes
dividing the nets into two sets: $C_{HF}$, and $C_{LF}$, where $CH_F$ contains the nets having high fanout and $C_{LF}$ contains the nets having small fanout, wherein the high fanout nets are those nets whose fanout is more than or equal to a fanout threshold value.

13. The non-transitory computer-readable storage medium of claim 12, wherein the applying the sequential routing that includes
partitioning the nets in $C_{LF}$ into three sets: $C_U$, $C_L$, and $C_{LU}$, where $C_U$ and $C_L$ contain non-overlapping nets, and $C_{LU}$ contains nets that lie in both partitions $C_U$ and $C_L$; and
performing sequential routing of nets in a union of $\{C_{HF}$ and $C_{LU}\}$ using a connection router $C_0$.

14. The non-transitory computer-readable storage medium of claim 13, wherein the applying net partitioning that includes
finding a cutline that separates the nets into upper and lower halves based on their bounding boxes while ensuring that each partition has nearly equal number of branches to route.

15. The non-transitory computer-readable storage medium of claim 14, wherein the applying net partitioning that includes
finding the cutline's vertical axis, denoted by I, which is equal to an index where one-to-one difference between elements of an array "Workload-after" and an array "Workload-before" is minima.

16. The non-transitory computer-readable storage medium of claim 15, wherein the applying net partitioning that includes
inserting all nets whose bounding boxes lie completely on an upper side of the cutline into $C_U$, and the nets whose bounding boxes lie on a lower side of the cutline into $C_L$, and the nets whose bounding boxes crosses the cutline are inserted in $C_{LU}$.

* * * * *